United States Patent [19]
Donath et al.

[11] Patent Number: 5,761,488
[45] Date of Patent: Jun. 2, 1998

[54] LOGIC TRANSLATION METHOD FOR INCREASING SIMULATION EMULATION EFFICIENCY

[75] Inventors: Wilm Ernst Donath, New York; Helmut Roth, Wappinger Falls, both of N.Y.

[73] Assignee: International Business Machines Corporation, Armonk, N.Y.

[21] Appl. No.: 662,383

[22] Filed: Jun. 13, 1996

[51] Int. Cl.$^6$ ................................................. G06F 9/455
[52] U.S. Cl. ................................ 395/500; 364/488
[58] Field of Search ........................... 364/488, 489, 364/490, 491, 578; 395/500, 51

[56] References Cited

U.S. PATENT DOCUMENTS

| | | |
|---|---|---|
| 4,527,249 | 7/1985 | Van Brunt . |
| 4,769,817 | 9/1988 | Krohn et al. . |
| 4,787,061 | 11/1988 | Nei et al. . |
| 4,852,093 | 7/1989 | Koeppe . |
| 4,970,405 | 11/1990 | Hagiwara . |
| 5,014,234 | 5/1991 | Edwards, Jr. . |
| 5,081,601 | 1/1992 | Eirikasson . |
| 5,302,866 | 4/1994 | Chiang et al. . |
| 5,355,321 | 10/1994 | Grodstein et al. . |
| 5,389,838 | 2/1995 | Orengo . |
| 5,394,443 | 2/1995 | Byers et al. . |

FOREIGN PATENT DOCUMENTS

| | | |
|---|---|---|
| 5329503 | 9/1979 | Japan . |

OTHER PUBLICATIONS

Kahle, JA et al., "Single–Latch Element Modeling Technique", IBM Technical Disclosure Bulletin, vol. 36, No. 8, Aug. 1993, pp. 355–356.

*Primary Examiner*—Kevin J. Teska
*Assistant Examiner*—Dan Fiul
*Attorney, Agent, or Firm*—Bernard M. Goldman

[57] ABSTRACT

A method of speeding up computer simulation/emulation of circuit logic designs. The method converts an original circuit logic design (intended for hardware packaging) to a different circuit form before starting computer simulation/emulation. The converted circuit form provides the same simulation/emulation results as would have been obtained with the original logic circuit. The method operates with multi-phase logic designs comprised of gate circuits using multi-phase clocking of the type commonly packaged in semiconductor chips. The method converts such multi-phase logic designs into a single-phase circuit form, which is presented to the computer for simulation/emulation that provides the same results as the multi-phase logic design but at a much faster speed. The method is presented with a multi-phase logic design containing flip-flops as the internal storage circuits. The method effectively retains the storage circuits found in a multi-phase logic design and replicates its logic blocks providing multiple phase outputs. Then the storage circuits are reconnected to the original and replicated logic blocks in a manner that enables a single clock cycle to operate the converted logic design to simulate/emulate the same results in the storage circuits, as if the original multi-phase logic design were being simulated or emulated, but at a much faster speed.

10 Claims, 7 Drawing Sheets

LOGIC TRANSLATION METHOD FOR INCREASING SIMULATION EMULATION EFFICIENCY

INTRODUCTION

The invention has discovered a method of greatly increasing the efficiency of computer execution for programs which simulate/emulate logic circuit designs. The terms "simulation" and "emulation" tend to be used interchangeably in the art, and their distinction is not clear; therefore they are used to mean the same thing for the purposes of this specification.

BACKGROUND

VLSI logic designs cannot be changed after fabrication into a silicon chip. Many current VLSI designs contain millions of logic gate circuits packaged into a single hardware chip. It has strained the present industry abilities to find a fast and fool-proof method of eliminating all errors in circuit design before such fabrication. Non-changeability after final packaging makes it essential for the packaged logical circuit design to be free of all "bugs". Examples of current silicon chip logic designs containing several million logic circuits are the IBM PowerPC chip and the Intel Pentium chip.

The present method of finding errors ("bugs") in complex logic designs is to simulate or emulate the design on a computer system, or in a special logic system, and to run data against the simulated/emulated design having known results. Hopefully, all bugs are found before fabrication, but recent history indicates that is not always the case.

Simulators/emulators include software executing in a general purpose computer system, and special computer systems designed for simulator/emulator operations.

Complex logic designs generally contain many levels (or layers) of logic circuits, in which each level provides outputs which are inputs to a next logic level. Each logic level generally produces its outputs for use by the next level, and any level may receive external data. The output of any logic gate in a design may skip one or more logic levels before being input to a gate at some other higher or lower logic level. Some logic gates may receive only external data inputs, and other logic gates may receive inputs which are the outputs from one or more other gates at one or more other levels in the design. Hence any logic gate may be classified in terms of the number of levels from which it receives inputs.

Conventional logic designs generally operate with many different levels of logic gates. The logic levels control the input/output dependencies among the gates in a logic design, and the different levels in the design need not be clocked by different phases of a multi-phase clock.

Latch circuits are generally used to store the outputs from the gate circuit levels, because latches provide the most economical storage in fabricated hardware, e.g. a silicon chip. Flip-flops are expensive to fabricate in hardware, but are less expensive than latches to simulate/emulate on a computer system. A flip-flop is set on the rising or falling edge of a clock cycle, and immediately transfers that set state to its output; and the flip-flop retains this output state until it is changed at the rising or falling edge of any subsequent clock cycle. On the other hand, a latch retains whatever input state it is receiving when each clock pulse ends, and that state can not be changed until the end of the next clock pulse.

Thus, simulated/emulated logic designs use flip-flops to store the outputs of its internal gates in the respective logic levels. The flip-flops for different logic levels are controlled by different phases of a clock in a multi-phase operation which allows time for the propagation of signals between the levels within the logic design.

Simulators/emulators use a representation of the logic gates and flip-flops in a logic design. However, simulators/emulators only execute one phase at a time for a logic design representation using assumed input data. The execution for each logic level generates results which are temporarily stored in the flip-flop representations for that level in the logic circuit design. The current states of all flip-flop output representations are available for use by every phase of a multi-phase operation.

In a very simplified manner, FIG. 3 represents a conventional combinatorial logic design using multi-phase clocking for respective groups of flip-flops which are respectively set at the beginning of an assigned phase cycle. FIG. 3 shows separate groups of flip-flops which are set by the respective phases of an N-phase clock used in a logic design; in reality the flip-flops of any phase group may be dispersed within a logic design. Multi-phase clocking for the conventional logic design is illustrated in FIG. 4. Each phase has the same cycle period, but the periods for the different phases start at staggered times relative to each other.

A simulator/emulator generally makes a separate computer execution pass for calculating the settings of the flip-flops assigned to each phase in the logic circuit design, which has been generally found to be the most efficient manner of performing simulation/emulation. That is, each computer pass for a phase generates output data for associated logic circuits by setting the flip-flop representations for that phase at the beginning of the next cycle for that phase.

The number of gate circuit levels will vary from one logic circuit design to another, and the number of clock phases will vary. However within a given logic circuit design the number of clock phases, and the number of levels, are fixed.

Conventional simulators/emulators make as many computer execution passes through a logic circuit design as there are clock phases in the design. Such prior computer simulation/emulation operations are represented in the bar chart shown in FIG. 1. In the bar chart, the Y-axis represents percent (%) of computer resource utilization. The X-axis represents time. Each of the bars along the X-axis represents the time for the computer resources to perform one operation. When the Y-axis height of a bar reaches "full capacity", the computer operation represented by that bar is using all of the resources of the computer system available for that logic design simulation/emulation.

Also in FIG. 1, the X-axis is divided into the respective phases 1, 2 . . . N of operation for a logic circuit design. The operations for each of the phases in FIG. 1 involve computer computations for representing the input and output states for the flip-flops and the logic circuits in the design. The computations for each phase may comprise only the computations for a subset of the overall logic in the design which is input only to the flip-flops set at the beginning of the assigned phase. However these logic circuit computations for one phase (providing inputs only for the flip-flops assigned to that one phase) may receive data input states representing the outputs of any of the flip-flops (for all phases).

Also, external data may be input to some or all of the same logic circuits in any phase of operation.

While the real hardware (in which a logic design will be fabricated) will operate sequentially in clock phase cycles 1, 2 . . . N (shown staggered in FIG. 4), computer simulator/ emulator resources do not operate in such a staggered manner. For the simulation/emulation of a logic design, the computer computes operations separately for each phase— before starting computer execution for the next phase of operation for the design.

FIG. 1 presumes a logic design having too many flip-flops for a single processing operation by a computer. That is, a large number of flip-flops may be used as inputs to the logic circuits which generate the outputs for the phase 1 computations. This may involve too many flip-flop-represented states to be accessed and processed in one computer operation by the computer resources available to the simulation/ emulation being done for the design—this is a common simulator/emulator problem. For example, suppose that phase 1 of a conventional logic design requires input data stored in 120 flip-flops, which is represented by binary data stored in the main storage of a computer system. The use of this phase 1 data for processing the operation of logic gates requires retrieval of 120 flip-flop-represented data states from the main storage of the computer system, which may involve too many accesses to be performed by the computer resources available in a single computer execution operation. For example, suppose only the data for a subset of 40 flip-flop-representations can be obtained in a single computer operation. In FIG. 1 each of the three (3) flip-flop bars then would represent one presumed computer internal operation, each for 40 flip-flop-representations totalling the 120 flip-flop-representations used in the phase 1 execution operations.

The flip-flop-represented data which is input for the phase 1 operations is retrieved from storage and tagged in association with the associated flip-flops. The represented logic for phase 1 operations then executes with this data, and these logic operations by the simulator/emulator are represented by a sequence of nine "logic" bars in FIG. 1 (following the three flip-flop bars for phase 1). The height of each logic bar represents the percent of computer resources used during the computer operation to simulate the logic operation on that data by a respective subgroup of logic circuits representing a logic level in the design.

During phase 1 as each logic operation (represented by a respective logic bar) is performed, the computer stores the results of the logic operation to represent new states for the respective phase 1 flip-flops. The data stored for these phase 1 flip-flops is then available (along with the states stored for the other flip-flops) as inputs for the logic circuits operating during other phases of the N number of phases.

The computer operations for simulating/emulating each of the other phases in FIG. 1 also start with one or more flip-flop bars followed by nine logic bars also representing execution by respective subgroups of logic circuits selectably receiving the flip-flop data. Thus for each phase in FIG. 1, the computer operation for each logic bar shown is for a different level of gate circuits in the design. The flip-flop data states accessed at the beginning of each phase is the data needed during the respective phase, and the flip-flops represented may be the same or different for the different phases.

The Y-size of the logic bars varies in FIG. 1, decreasing from left to right within each phase of the computer operation. This variation is because the number of logic gates (generating the flip-flop data for the respective phase of operation) generally decreases with an increasing level of gate logic, which involves a corresponding decrease in the computer resources used to perform the respective logic operations.

Unused computer resources (not used during the different levels of computer logic circuit operations) are also not available to any other computer operation, when they are reserved for the simulation/emulation operations for the logic design. The Unused computer resources are represented in FIG. 1 by the space above the logic bars shown for each of the N phases in FIG. 1 and are representative of unused available resources.

Accordingly, FIG. 1 represents conventional computer operations which require a computer run for each of the N phases, in which each computer run uses all of the logic in a simulated/emulated design to compute the results of one simulated clock cycle of operation. That is, a separate computer run is made for each of the N phases to compute the results of each phase of operation. This invention discovered a way to compress the simulation/emulation operations of all of the N phases into a single computer run for each simulated clock cycle of operation.

Each of phases 2 . . . N is assigned the same computer resources as required for the phase 1 operations. Each of the phases uses its own flip-flops for storing its data. That is, the flip-flops for each phase are different from the flip-flops for the other phases. The number of flip-flops in each phase may be the same as or different from the number of flip-flops in any other phase (a different number is assumed in FIG. 1).

Each phase is assumed in FIG. 1 to start by retrieving the data stored by its flip-flops. Thus phase 2 starts by retrieving the data stored by phase 2 flip-flops, etc.

The logic circuits receiving the flip-flop data for any of the phases may be the same as, or different from, the logic circuits receiving the flip-flop data for any other phase. The number of logic circuits used by any phase also may be the same as, or different from, the number used for any other phase (for the nine logic bars in each phase).

There will be the same number of phase operations in the computer simulation/emulation as there are phases for the hardware clock in the logic design being simulated/ emulated.

With some simulators/emulators, the flip-flop bars may be interspersed with the logic bars, so that required flip-flop states (represented by the flip-flop bars) may be accessed later during the logic operations (represented by logic bars), so that the flip-flop states may be retrieved closer in time to when they will be used by logic circuit computation operations.

The computer time used by a completed simulation/ emulation operation is therefore dependent on the number of clock phases provided in the hardware design. But the total amount of time required for a simulation/emulation run depends on many variables such as the speed and resources of the computer system performing the simulation/ emulation. In prior systems, a complete simulation/ emulation operation for a complex processor has been known to take months of computer time.

A computer having insufficient resources (e.g. insufficient memory and I/O space to handle the entire logic representation for a given design in each computer operation) may require at least the initial logic levels in a design to be handled in multiple computer operations. Prior simulator/ emulator operations have been limited to handling designs containing substantially less than one million logical gate circuits because of limitations in the computer efficiency. Where the number of logical gate circuits in a hardware design has exceeded the capacity of the simulator/emulator, it has been necessary to divide the hardware design into sections which are separately simulated/emulated, and then problems have been encountered in trying to integrate the results of the separate simulations or emulations of the sections to determine the correctness of the overall hardware design. This integration operation has lead to erroneous conclusions for particular designs. Therefore, it can be appreciated that a substantial advantage is obtained in being able to perform a single simulation/emulation on an entire logical circuit design containing millions of logical circuits, so that operational failures, which may not be observable in prior sectional simulations/emulations, may be observed.

The performance of prior simulation/emulation systems has been relatively slow: they run at 6 to 8 orders of magnitude slower than the final packaged hardware they are simulating/emulating, which is a characteristic that has significantly reduced the amount of simulation which can be done for a design having millions of circuits within the time constraints of the real world. The subject invention therefore provides the advantage of greatly speeding up the use of existing simulators/emulators without requiring changes in the existing simulator/emulator.

The invention is very advantageously applied to emulator systems built according to prior-filed application Ser. No. 08/253,881 (PO9-93-046) which runs 2 or 3 orders of magnitude faster than its prior simulators/emulators and is able to handle much larger logic designs, such as designs containing more than 10 million two input logic gates.

It is to be observed from FIG. 1 that a particular amount of computer processing time P is required for processing each phase of operation during the simulation/emulation of a logic design. Then, the total time T for processing one cycle comprised of all the N phases of simulation/emulation operation for a conventional logic design is therefore T=N*P.

SUMMARY OF THE INVENTION

FIG. 2 shows a bar graph representing an example of a simulation/emulation operation for a logic design using the subject invention. The simulator/emulator used for FIG. 2 may be the same as for FIG. 1.

The novelty in the subject invention is not in the simulator/emulator, but is in a method described herein for modifying a logic design before its presentation to a computer for simulation/emulation. The modified logic design provided by this invention is presented to the computer for the simulation/emulation of the logic design instead of the original multi-phase logic design.

This invention's modifications to the logic design enable a significant speed up in the simulation/emulation operations without changing the simulator/emulator, while enabling the computerized simulator/emulator to provide the same simulation/emulation results that would have been provided if the logic design were not modified.

The subject invention can increase the speed of simulation or emulation by up to a factor of N, where N is the number of phases in the multi-phase clocked given logic circuit design. For example, if a conventional simulation/emulation of a 5 phase logic design took 5 weeks of computer operation, it may take about one week of computer operation when this invention is used, i.e. a savings of up to 4 weeks of computer time by using this invention on the same simulator/emulator. Thus, the invention provides a method of changing an N-phase clocked logic design into an equivalent single-phase clocked logic design, and the latter is presented to the computerized simulation/emulation operation to obtain: A. Significant savings in computer operating costs, and B. A speed up in the simulation/emulation operation, even in a fast high capacity emulator of the type in prior application Ser. No. 08/253,881 (PO9-93-046).

Hence, it is an object of the subject invention to significantly increase the performance of simulation/emulation operations in modeling hardware logic gate designs, compared to the performance obtained for equivalent hardware designs using multi-phase clocked logic gates.

It is a feature of the subject invention to provide a method of transforming multi-phase gate logic designs into single phase logic designs which are logically identical to their multi-phase logic designs to enable improved simulator/emulator performance. The transformed logic design can be simulated/emulated in a fraction of the time that would be needed to simulate/emulate the original multi-phase design.

It is a further feature of the subject invention to provide a method of transforming multi-phase gate logic designs into single phase gate logic designs. The method effectively uses the same storage circuits (e.g. flip-flops) in both the multi-phase and single-phase equivalent designs to store the same states in both designs. Each logic block in the multi-phase design has its output states captured during the clock cycles in one or more storage circuits associated with that logic block. Circuit changes are needed to convert the multi-phase design to the single-phase design; these circuit changes require replicating any logic block having more than one associated storage circuit. Logic block replication is done where needed in the single-phase version to provide a one-to-one relationship between each of the storage circuits and a different but identical logic block (original or replicated logic block) in a logic block arrangement that corresponds to each logic block in the original multi-phase design. This one-to-one relationship enables all identical logic blocks to store their outputs in parallel in the storage circuits in the same cycle of a single-phase clock, instead of sequentially as is done in the sequential phases of each cycle of a multi-phase clock in the multi-phase logic design.

The transformed logic design can be simulated/emulated in a fraction of the time that would be needed to simulate/emulate the original multi-phase design.

It is a further object of the subject invention to transform a multi-phase logic design into a single-phase logic design which is logically equivalent and which can use the same externally applied data to generate the same simulation/emulation results as the multi-phase design using much less computer time.

The process of this invention receives a submitted logic design as its input. The design generally will be in the form of logic gate circuits, e.g. AND, OR, EXCLUSIVE OR, INVERT gates, etc.

The process of this invention begins by identifying groups of connected gate circuits, herein called "logic blocks", throughout a conventional logic design. A logic block is defined herein as containing one or more gate circuits which operate together to provide a single signal output to a flip-flop having its input triggered at one of the plural phase clock times. Some logic designs may contain hundreds of thousands of such logic blocks and corresponding flip-flops. Different flip-flops are triggered to store the output of an associated logic block at the beginning of clock cycles operating at different phases. The binary state of the input signal appears at the flip-flop output to represent the state of the flip-flop in only a small fraction of a cycle after being triggered in. A new flip-flop output state is then immediately presented to the inputs of all circuits connected to the output of the flip-flop.

After the logic blocks are identified in the logic design, a next step in the subject invention is to identify the one or more flip-flops (FFs) which sample the output of the block at the beginning of respective clock phase(s). m is the number of the sampling clock phase(s) associated with the FFs connected to each respective logic block. Some FFs will sample at all N clock phases, other FFs will sample at only one of the phases (which may be any of the N phases), and other FFs will sample at m number of phases (m is a number between 1 and N). The phases of the m number of FFs connected to a block may skip one or more of the numbers from 1 to N; hence these m number of FFs may not be consecutively numbered in their sequence of phase numbers. The numbering sequence may not begin with the number 1 and may not end with m. Some blocks may be sampled by only a single flip-flop, and other blocks may be sampled by a plurality of flip-flops.

This invention replicates each original logic block having m>1 sampling FFs (i.e. the block outputs are sampled by more than one FF operating at more than one phase). Each m=1 original block is sampled by only one phase, which can be any phase, and is not replicated. Thus, m is the total number blocks comprising each original block and its replicated block(s).

Accordingly, if m=1 there is no block replication (only one sampled phase), and if m>1 then block replication is done. The maximum value of m is N which is the total number of phases used in the logic design.

Logic block replication involves duplicating the original logic block m−1 number of times by providing identical block representations. That is, each original block having m>1 will have m−1 replications.

Each original block is initially assigned the phase number of its lowest-phase sampling FF; this initially assigned number will be a number from 1 to N. Each original logic block and its lowest-phase FF in the original logic design may be considered a block/FF pair, in which the block and the FF are each numbered with the sampling phase of the FF. Each other sampling FF using a higher-numbered phase is associated with one of the respective replicated logic block (s), and this block is initially given the number of the associated FF. Each replicated block and its associated FF may be considered a replicated block/FF pair for each of the m−1 replicated pairs provided for each original block.

In each replicated pair, the flip-flop representation may be considered a new FF or it may be considered the old sampling FF being differently connected for the translated logic design.

All pairs for each m>1 original block are sequenced according to their associated phases from the lowest-numbered pair (original pair) through its replicated pairs (having higher numbers), since the pairs are numbered in the sequence of their associated sampling phases. The initial phase numbers assigned to the sequence of pairs for each m>1 original block need not have consecutive numbers, and the numbering need not start with number 1. Each m=1 original block has only one pair and it need not initially have number-1.

Then renumbering is done for all sequences to a new sequence which always starts with 1 and always uses consecutive numbers in which m is the highest number. Thus each m=1 pair is renumbered as block-1 and its sampling FF is renumbered as FF-1 (they will thereafter only be operated at phase-1). In the sequence for each m>1 original pair, the original block is renumbered as block-1 and its FF is renumbered as FF-1; and its replicated pair(s) are renumbered consecutively, starting from 2 and ending with m. Hence, the lowest-phase original pair is renumbered as block-1/FF-1, the next pair in the sequence is renumbered as block-2/FF-2, etc., up to the last pair in the sequence which will have number m which cannot be greater than N.

For example, if an original block has its outputs sampled by three FFs operating at phases 2, 4 and 7, that original block has m=3. Its two replicated blocks are determined by m−1=2. The original and two replicated blocks form a sequence of three pairs initially numbered 2, 4 and 7. The pairs 2, 4 and 7 are then renumbered by respectively assigning them consecutive numbers 1, 2 and 3 (always starting from number 1). Hence, they are renumbered as block-1/FF-1, block-2/FF-2 and block-3/FF-3. The renumbered FFs may be considered new FFs, (or they may be considered the old FFs that are being reconnected in the translated logic design.

This final consecutive renumbering maintains the low-to-high ordering found in each initial numbering sequence described above for block replication. A final renumbering assigns 1 to each "original block/original FF" (which is the pair sampled with the lowest-numbered phase in the original design). The pairs in each sequence are now consecutively renumbered 1 . . . m while maintaining their prior phase numbering sequence. In that sequence, block-1 sampled by FF-1 is the original block and its associated FF. And each replicated block I in the sequence is renumbered from 2 to m, which is in the range of values represented by the expression 2<=I<=N.

The block connections are then reconnected as follows: The output of logic block-1 is sampled at phase-1 to the input of FF-1, and the output of FF-1 is connected to an input of block-1 and to each replicated block I, i.e. (2<=I<=N). The output of each replicated block-I is connected to the input of FF-I. Also, the output of replicated block-I is connected to an input of logic block-1 and to an input of each logic block J having a number greater than I, i.e. (I<J<=N). The output of FF-I is connected to an input to each replicated logic block J having a number less than or equal to I, i.e. (2<=J<=I). Finally, the triggering clock phase for all FFs is made clock phase 1.

This method is applied to all logic blocks in the original logic design to obtain a transformed logic design which significantly increases the performance of a simulator/emulator.

SUMMARY OF THE DRAWINGS

FIG. 1 shows the simulator/emulator use of computer resources as a function of time for each of multiple phases of operation by the computer.

DESCRIPTION OF THE DETAILED EMBODIMENTS

The invention provides a metamorphosis process for electrical logic circuits which has been found useful in providing input to simulators/emulators of logic designs made of these circuits. The metamorphosis retains the equivalency of a logic design between a multi-phase form of the logic design to be packaged in hardware and a single-phase form of the same logic design which this invention has found can significantly increase the performance of simulators and emulators of the logic design for significantly reducing the resources and time needed to perfect the logic design.

Although the metamorphosis process of this invention considerably changes the electrical circuits comprising an original multi-phase logic design, the transformed single-phase version of the logic design performs the same logical operations as the original design to enable the evaluation of the logic design to be performed with more efficient use of simulation or emulation resources.

Figure 1:
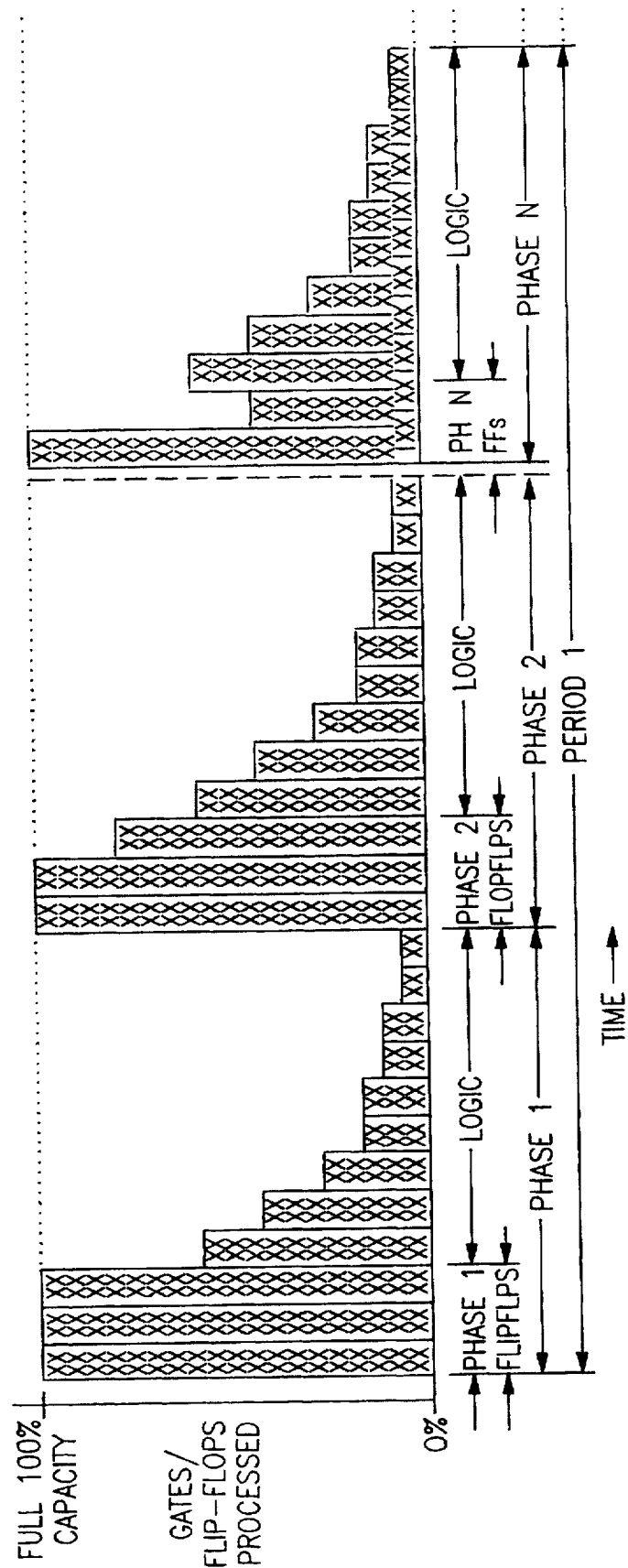
FIG. 1 shows a prior-art bar chart which represents the operation of a computer simulator/emulator using prior art multi-phase methods.
Figure 2:
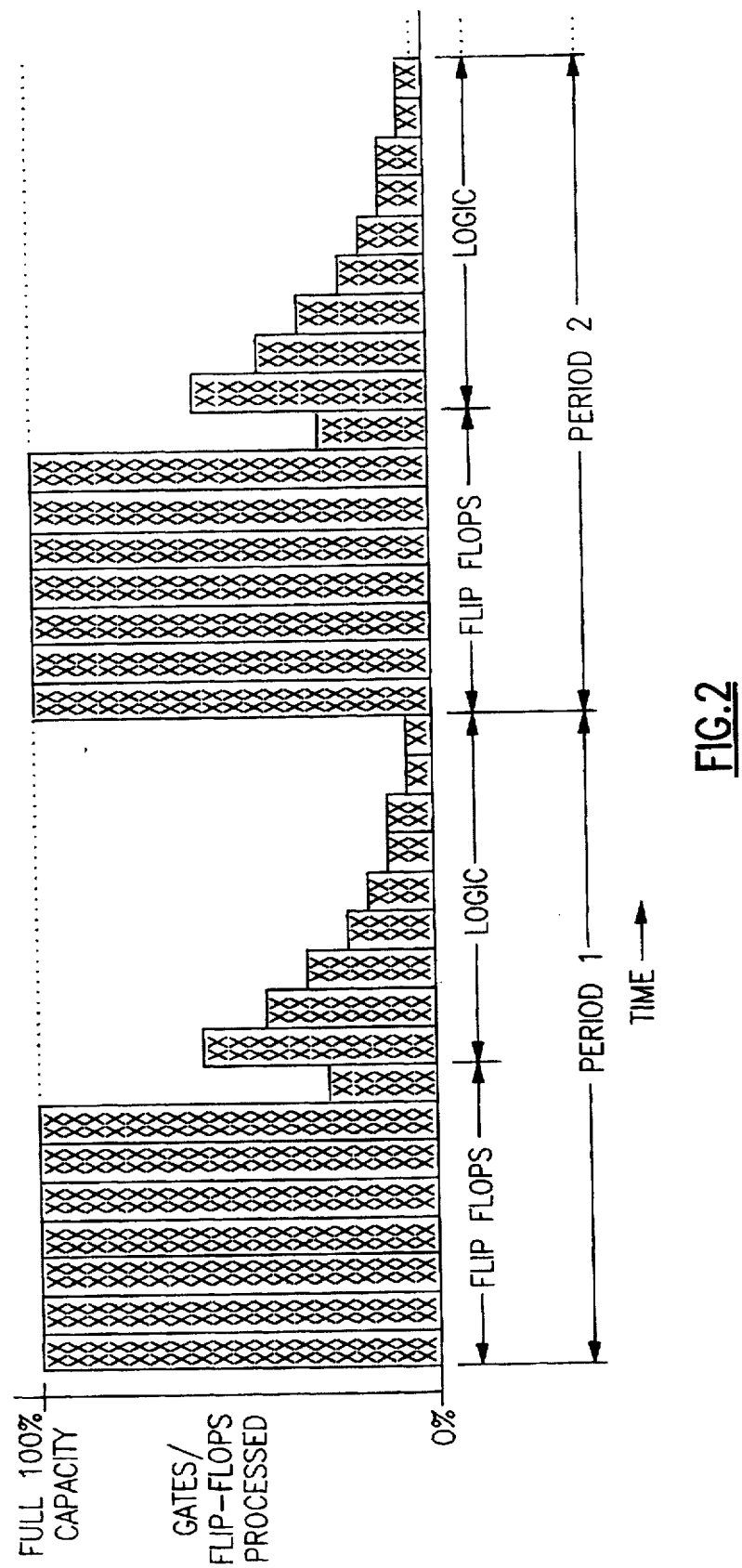
FIG. 2 shows a novel bar chart which represents the operation of a computer simulator/emulator when it is using the subject invention, in which assigned computer resources are scheduled within a single phase of operation shown as a function of time.
Figure 3:
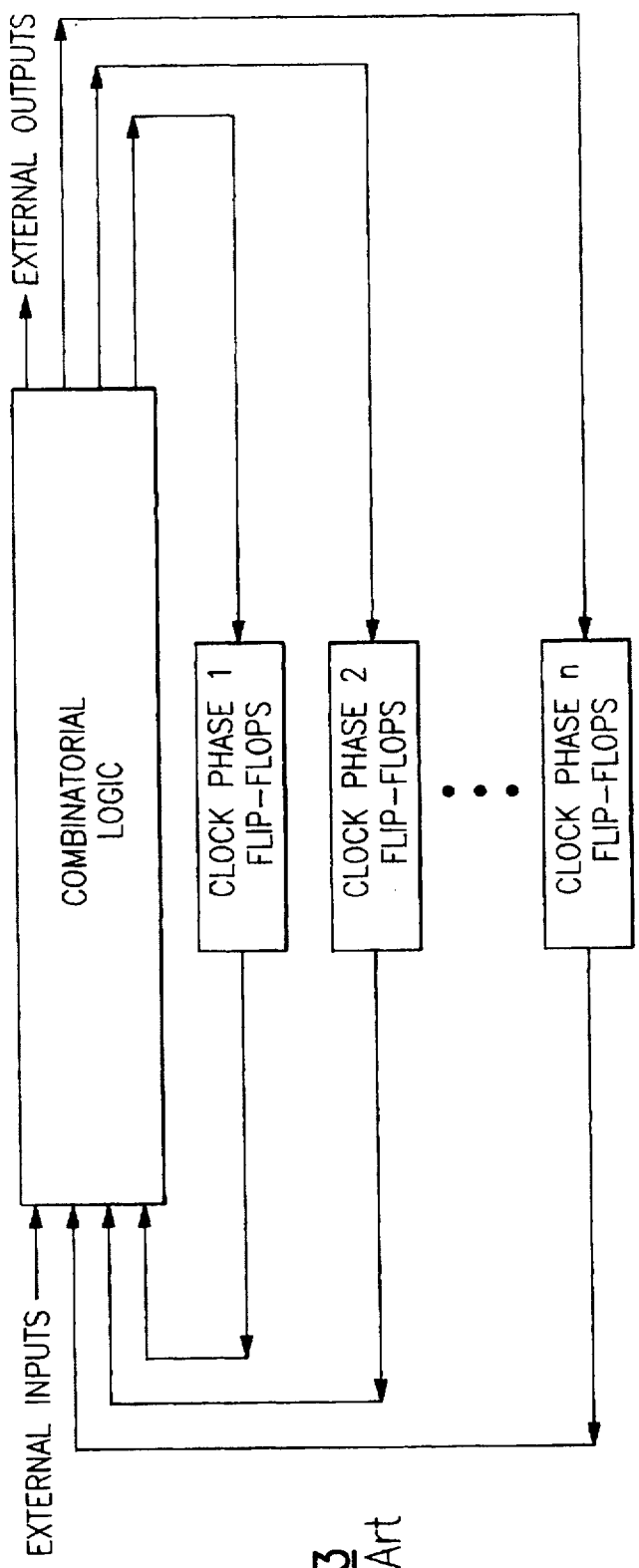
FIG. 3 is a simplified representation the multi-phase clocked hardware logic designs found in the prior art, which may be used as a starting point for applying the subject invention.
Figure 4:
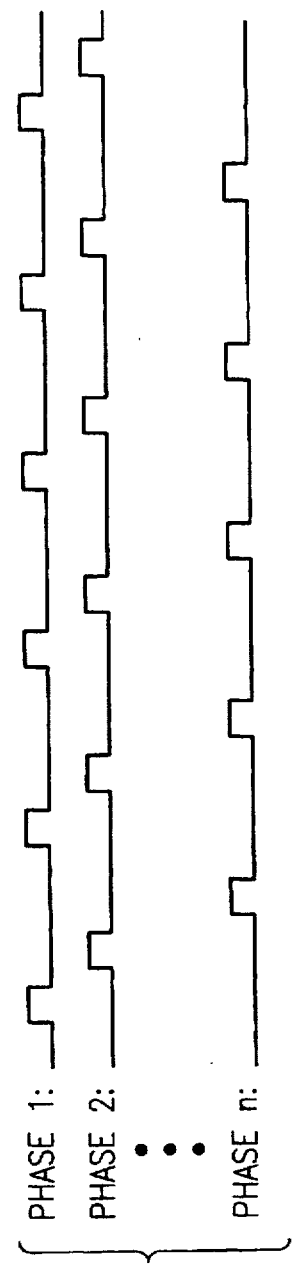
FIG. 4 shows wave forms for an N-phase clock.

FIG. 2 is illustrative of the use of computer resources by the transformed single-phase logic design during each cycle of simulator/emulator operation. The same logic functions execute during each one-phase cycle (shown in FIG. 2 as period 1), as are performed during each N-phase cycle (shown in FIG. 1 also as period 1).

Each single-phase cycle in FIG. 2 is somewhat longer than each phase subcycle in the N-phase cycle in FIG. 1. But each single-phase cycle is much shorter than all N subcycles comprising one N-phase cycle of operation in FIG. 1. This is because in FIG. 2 the states of all flip-flops (FFs) in the transformed logic design are accessed during each single-phase cycle, compared to FIG. 1 in which the states of only a subset of all FFs in the original logic design need be accessed during each respective subcycle of the N-phase cycle in FIG. 1. Thus, only the states of the FFs used during a respective phase need be accessed for operation of the respective phase of the simulator/emulator.

Also for FIG. 2, execution during each single-phase cycle is provided for the logic circuits and FFs in all logic levels being simulated or emulated; this execution includes the replicated block circuits. Although the overall number of circuits in the transformed logic design has increased due to the added replicated blocks, it will be noted in both FIGS. 1 and 2 that the nine graph bars for the nine levels of logic block execution represent that less than 100 percent of computer resources are used, which indicates that the replication has not slowed the computer operations.

In FIG. 2, seven of the eight flip-flop bars are operating at the 100 percent computer resource level, and in FIG. 1 a lesser number of flip-flop bars are shown in each phase of operation. This is because in the multi-phase operation, only the FFs used during a respective phase are shown—the subcycle of operation for each phase includes FFs input to the blocks and FFs triggered by block outputs during the respective subcycle phase operation. The sum of all graphed FF bars for all phases per multi-phase cycle will equal or exceed the total number of FF bars in the single-phase cycle which represent all FFs used. This may result in the processing time for each single-phase cycle of simulation/emulation being slightly longer than any one of the N subcycles in the multi-phase operation. But the overall processing time for all N number of multi-phase subcycles in each multi-phase cycle is much longer than the single-phase cycle, although it may not necessarily equal N times longer, which is an upper bound approximation. For example, a single-phase transformation of a 5-phase logic design may operate a simulator/emulator three or four times faster (instead of 5 times faster) than a multi-phase simulation/emulation based on the original 5-phase logic design.

Figure 7:
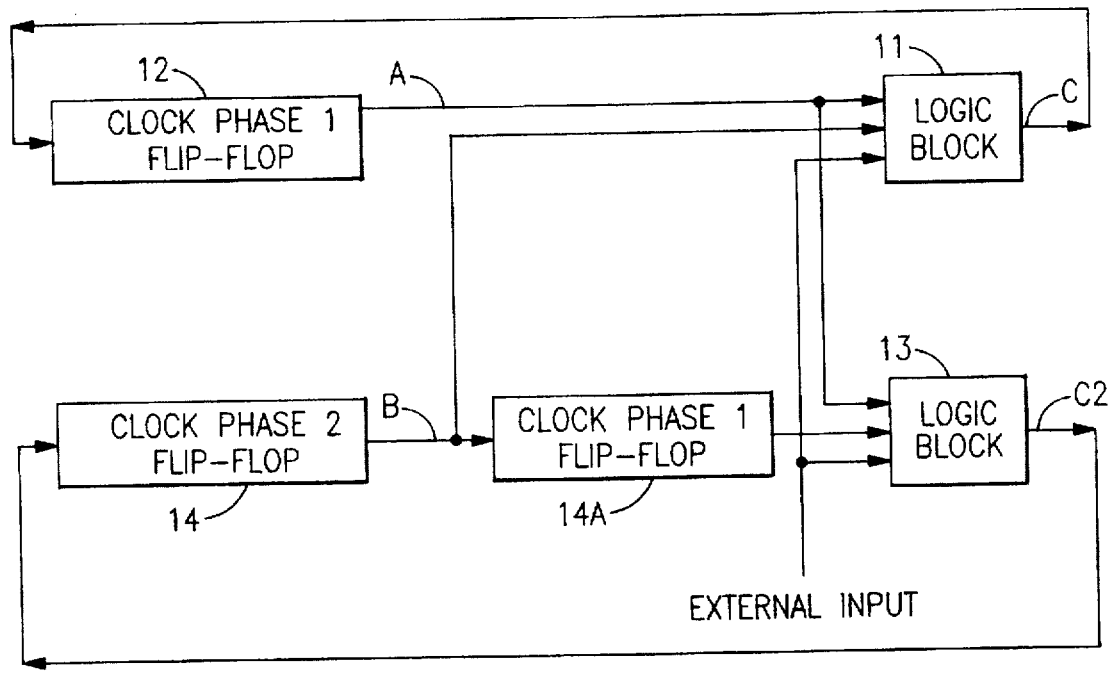
FIG. 7 illustrates the result of a next conversion step in the metamorphosis process for transforming the logic design of FIG. 6 into an intermediate circuit form.
Figure 8:
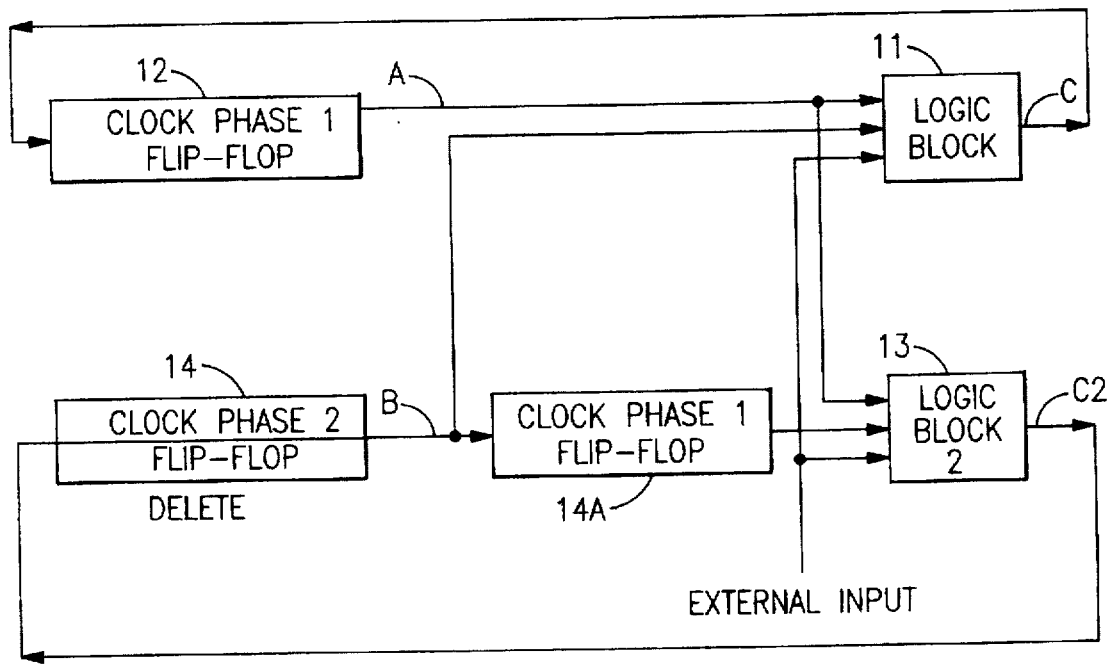
FIG. 8 illustrates the result of a further conversion step in the metamorphosis process for transforming the logic design of FIG. 7 into an advanced form of the logic design.
Figure 9:
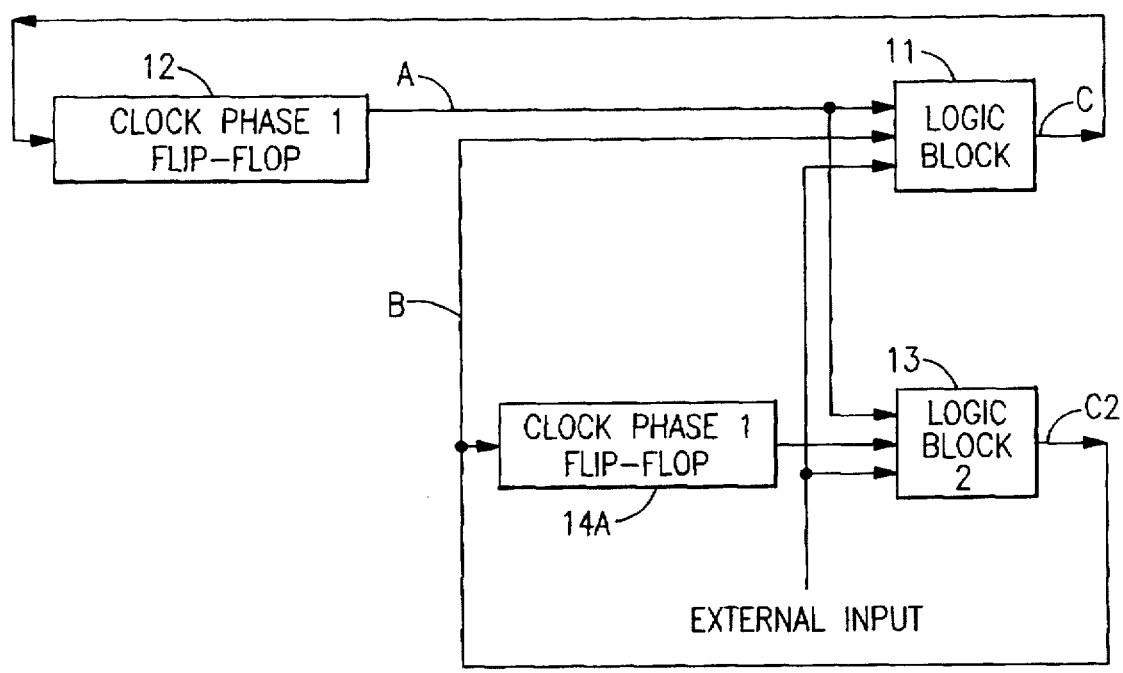
FIG. 9 illustrates the final single-phase form of the multi-phase circuit design in FIG. 5 in the metamorphosis process provided by the subject invention for transforming the multi-phase logic design into a form enabling a single-phase type of operation for a simulator/emulator of the logic design.
Figure 10:
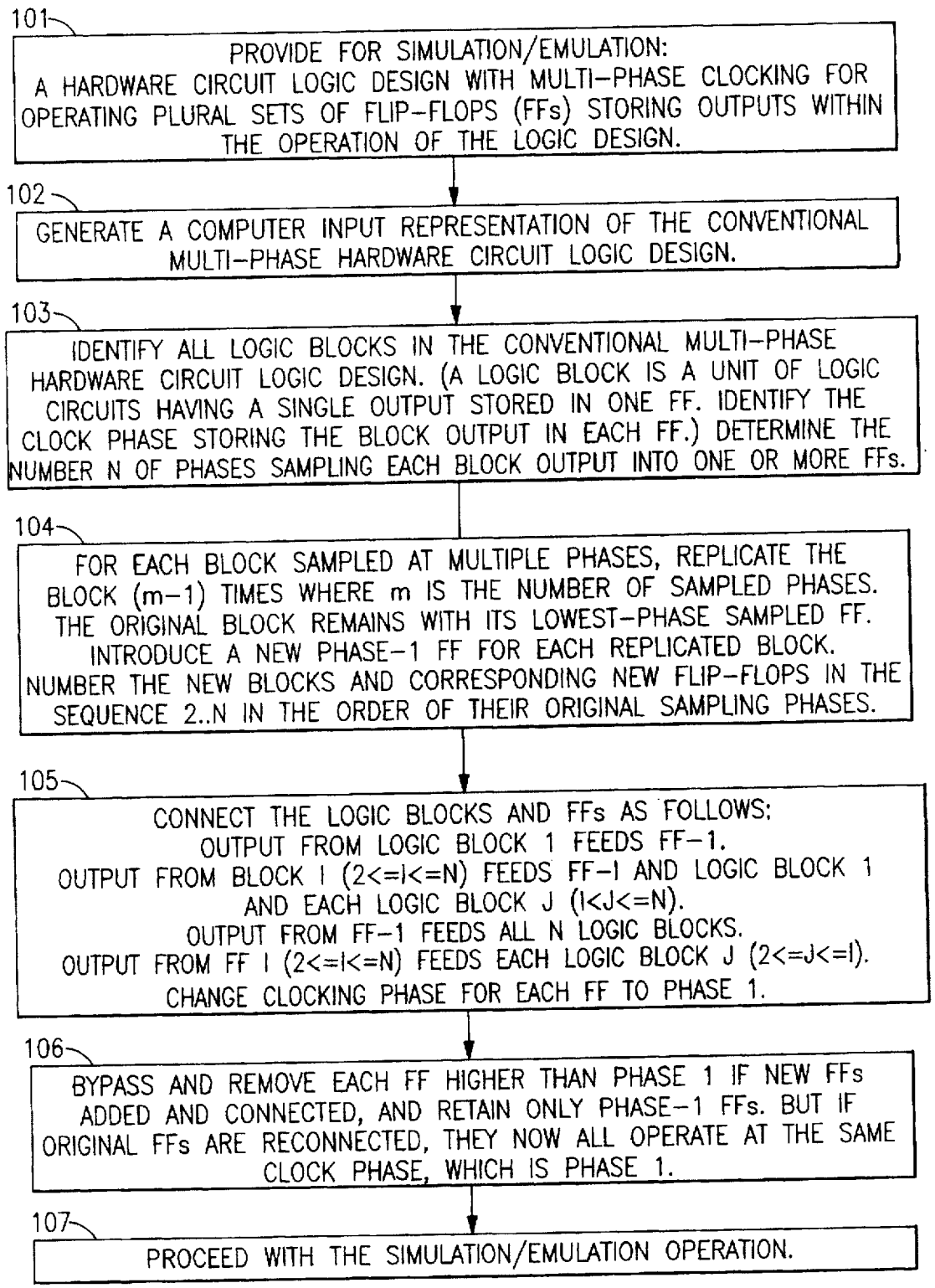
FIG. 10 is a general flow diagram of the metamorphosis process of the subject invention.

FIGS. 5, 6, 7, 8 and 9 illustrate a simplified example of circuit changes occurring in the process of the subject invention for transforming a multi-phase logic design (shown in FIG. 5) into a single-phase form of the same logic design (shown in FIG. 9). This simplified example is provided for aiding an understanding of the operation of the invention. The general method of the subject invention is represented in FIG. 10, which is the preferred embodiment.

The invention provides a metamorphosis from a multi-phase version of a logic design (represented in FIG. 5) into a single-phase version of the same logic design (represented in FIG. 9). The single-phase form (illustrated in FIG. 9) is used by this invention for representing the logic design to a computer-operated simulator/emulator to greatly increase its speed of operation, even though the multi-phase version will be the version of the logic design used in the hardware packaged form (e.g. the circuits formed in a silicon chip). However, modifications to the multi-phase version may be indicated from results obtained in the simulation or emulation performed with the single-phase version if such results indicate problems in the logic design.

Figure 5:
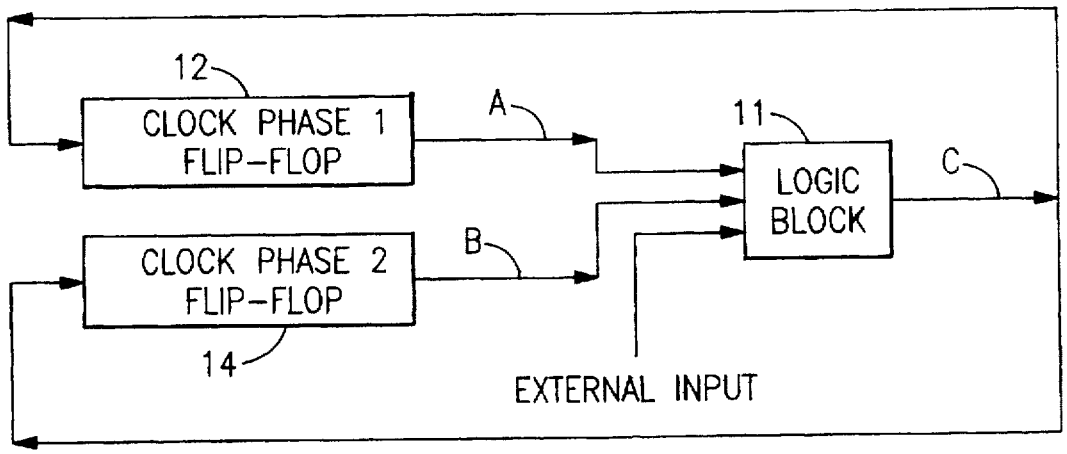
FIG. 5 shows a simple example of a conventional two-phase logic design used herein as a starting point in a metamorphosis process provided by this invention for transforming the logic design to an equivalent single phase logic design for providing input for a simulator/emulator to significantly increase the performance of the simulating/emulating process.

FIG. 5 begins the circuit metamorphosis by representing a multi-phase version of a logic design. It has a logic block 11 with outputs clocked by two clock phases 1 and 2 into flip-flops 12 and 14. That is, the output of the logic block 11 is sampled at clock phase 1, when its output C is stored in a clock phase 1 flip-flop 12. At phase 2, a different output C2 from block 11 is stored in the clock phase 2 flip-flop 14.

Figure 6:
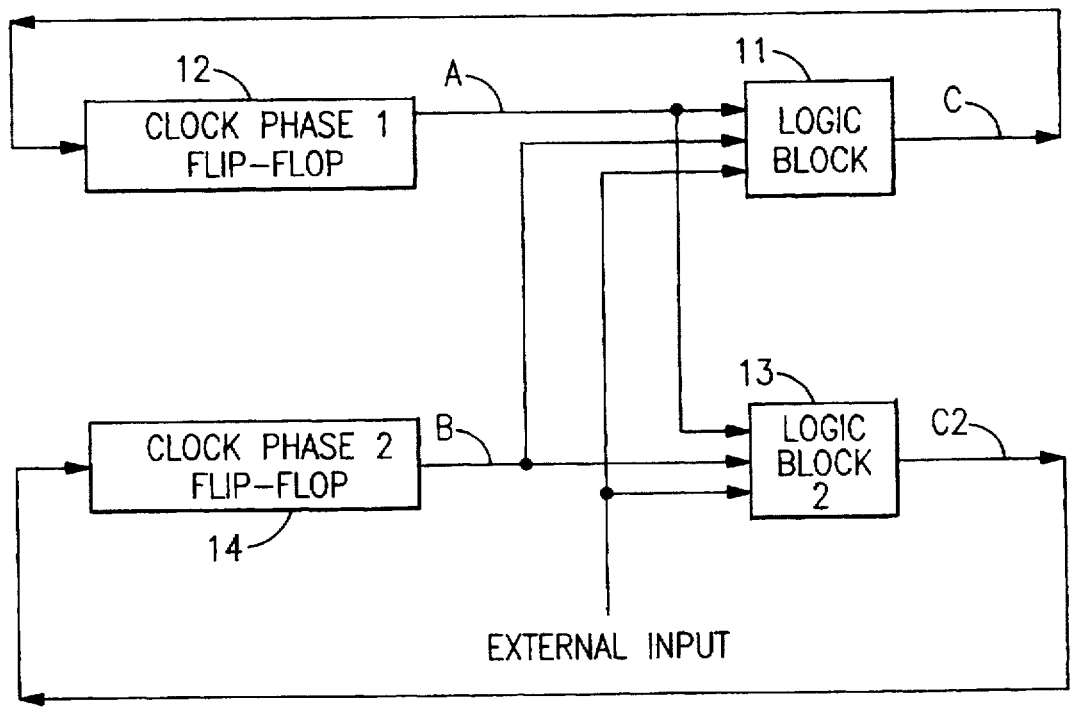
FIG. 6 illustrates an initial modified form of the circuit design in FIG. 5 in the metamorphosis process of this invention for transforming the logic design of FIG. 5 into an equivalent single-phase logic design provided by the subject invention.

FIG. 6 shows the first metamorphosis which is an initial transformation of the FIG. 5 multi-phase circuits to the modified multi-phase circuits shown in FIG. 6. FIG. 7 shows a next multi-phase circuit transformation, which inserts a phase 1 FF 14a. FIG. 8 shows the deletion of the phase 2 FF to obtain the single-phase version; and FIG. 9 shows the single-phase version of FIG. 8 only containing phase-1 FFs. As previously explained herein, the effect of this circuit conversion from the multi-phase version to a single-phase version enables the invention's converted single-phase model to run faster than the received multi-phase model in a simulation/emulation computer when using the same input/output data. The circuit metamorphosis includes adding replicated logic blocks, reassigning phase-1 to non-phase-1 FFs, and their reconnection, as the circuit alteration process proceeds in the sequence from FIG. 5 to FIG. 9. FIG. 10 describes the reconnections that occur during this metamorphosis.

In order to aid an understanding of the logic-circuit equivalency of the different circuit versions occurring during the transformation process of the subject invention, examples of their equivalency are shown for the different circuit versions occurring from FIG. 5 to FIG. 9. For simplicity here, logic block 11 in FIG. 5 is assumed to be an AND gate, although in real logic designs logic block 11 may be much more complex and represent a connection of many types of combinatorial logic gates. The equivalency analysis is as follows:

In FIG. 5, AND logic block 11 has inputs A, B and E. E is external input. A and B are the initial output states of clock phase-1 FF 12 and of clock phase-2 flip-flop 14, respectively. At clock phase-1, FF 12 stores output C being output from block 11, as follows:

$$C = A \& B \& E$$

After FF 12 triggers in the value C at clock phase 1, immediately thereafter value C is stored in and output from flip-flop 12. Note that the triggering of FF 12 by phase-1 does not affect the output B of phase-2 FF 14. Then, before the occurrence of the following clock phase 2, the gate 11 output becomes C2:

$$C2 = C \& B \& E$$

At the next phase-2, FF 14 triggers in output C2 from block 11, and immediately thereafter the output of FF 14 changes to C2. Note that during the phase-2 triggering, output C in FF 12 is not affected.

In the next transformed circuits in FIG. 6, a replicated gate 13 is provided, and is connected as shown. After phase-1, the gate 11 output C is triggered into FF 12 as in FIG. 5:

$$C = A \& B \& E$$

But in FIG. 6 before the following clock phase-2, the gate 13 output becomes C2:

$$C2 = C \& B \& E$$

At the next phase-2 cycle, the gate 13 output C2 is triggered into FF 14 to change the FF 14 output from B to C2: Note that during phase-2, the output C of flip-flop 12 is not affected.

In the next circuit transformation shown in FIG. 7, a phase-1 FF 14a is placed between the output of phase-2 FF 14 and the input of block 13. As in FIG. 6, the C output of block 11 is set into FF 12:

$$C = A \& B \& E$$

The first phase-1 cycle also sets the B signal from FF 14 into FF 14a. Immediately thereafter, output B is then provided by FF 14a as an input to block 13, while C is also being input from FF 12 to block 13. Then Block 13 outputs C2:

$$C2 = C \& B \& E$$

At the next phase-2 cycle, the C2 output of block 13 is set into FF 14.

FIG. 8 shows the removal of the phase-2 FF 14, so that the prior B value is stored in FF 14a instead of FF 14. Value B was the prior output triggered into FF 14 in FIG. 7 from gate 13, and therefore in FIG. 8 is instead triggered from block 13 into FF 14a at the next phase-1 cycle.

FIG. 9 has the same logic as shown in FIG. 8, but shown without the removed FF 14. It is important to understand that the initial output B from block 13 is direct input to block 11, so that when FF 12 stores output A from block 11, block 11 immediately thereafter outputs C:

$$C = A \& B \& E$$

Output B from block 13 is stored in FF 14a at the same time as C is stored in FF 12, so that FF 14a immediately thereafter outputs C2 during the latter part of the same phase-1 cycle:

$$C2 = C \& B \& E$$

At the next phase-1 cycle, FF 14a stores C2 from block 13; and C2 remains at the output of block 13 for the remainder of that phase-1 cycle.

Recognition of the equivalency of the states within the N phases of a multi-phase version and of the states within the transformed single-phase version of a logic design is an unobvious attribute of the subject invention.

FIG. 10 shows a flow diagram of the general method of this invention. Its step 101 involves providing a multi-phase logic design which is to be simulated/emulated to verify the design and find any problems in its circuit logic structure. Such a logic design contains logic gate circuits, e.g. AND, OR, EXCLUSIVE OR, INVERT, etc. which form logic blocks that have outputs triggered into FFs.

Step 102 involves generating a computer representation of all of the logic circuits and their connections in the logic design to each other and to the respective multi-phase clock phases.

Step 103 identifies groups of gate circuits herein called "logic blocks" throughout the logic design. A "logic block" is defined herein as containing one or more gate circuits which are connected and operate together to provide a single output signal which has its state stored in a single flip-flop at a predefined clock phase. Some logic designs may contain hundreds of thousands of such logic blocks and corresponding flip-flops. Different flip-flops may be triggered by different clock phases to store the outputs of the associated logic block at different times during clock cycles operating at the different phases. Each FF stores a binary signal state at the rise (or fall) of a clock phase, and immediately thereafter passes the signal to the FF output, from which that state can be presented as input to some of the logic blocks. The FF output state is presented to the inputs of its connected logic blocks at least until after the start of the next cycle of the same phase. And the number of phases N is identified.

Step 104 first determines which blocks need to be replicated; replication is done by making a copy of the computer representation of a block. To determine which blocks need replication, and how many replications need to be made of any block, a number "m" is determined for each block by counting the number of phases used by the FFs to sample the output of each block in the logic design. Any block may be sampled by any number of the N phases. For example, a block output may be sampled by FFs operated at clock phases 2, 4 and 7 in a logic design using 8 clock phases. Thus, some blocks may be sampled at all N clock phases, other blocks may be sampled at only one of the phases (which may be any of the N phases), but all blocks will be sampled at m phases (m is a number between 1 and N). Each block is thereby assigned a sequence of one or more numbers in the range from 1 to N.

Further, step 104 determines if the m value equals one (1), or if m is greater than one, m>1, for each block in the received multi-phase logic design. The blocks in the received multi-phase logic design are herein called the "original blocks" to distinguish them from "replicated blocks" which are included in only the single-phase version of the logic design. Only original blocks have m values. If m=1, no replication is done of that original block. If m>1, then m−1 replications are done of that original block. The original and its replicated blocks are each assigned a phase number, of which each original block is assigned the number of its lowest-numbered sampling phase (used by a FF receiving its output). If m=1, the original block is assigned the number of its only sampling phase (of its only connected FF). If m>1, the phase numbers of all of its m sampling FFs are used; the lowest sampling phase number is assigned to the original block, and the remaining m−1 sampling phase numbers are assigned to its m−1 replicated blocks. These assigned numbers provide a sequence comprising all of the phases sampling each m>1 original block. (This sequence is used in the next step to control the interconnections among the original and its replicated blocks and associated FFs, even though all FFs will eventually have their phases changed to phase-1. Eventually, the m number of blocks in the sequence are consecutively renumbered in the order of their associated phase numbers, beginning with the number 1 and ending with m.) Each original block and its lowest-phase FF may be considered a block/FF pair numbered with the sampling phase of the block's lowest-numbered sampling FF. Each other sampling FF (for each m>1 original block) is associated with a respective replicated logic block, and this replicated block and the like-numbered FF may be considered a replicated block/FF pair of m−1 replicated pairs represented for each original block. (This lowest numbered pair will be later renumbered as block-1 and FF-1.)

In each replicated pair, the associated FF may be considered to be one of the FFs in the received logic design. However, these FFs may instead be considered to be new sampling FFs operating only at phase-1, which will replace the old sampling FFs in the single-phase version of the logic design.

For step 105, each sequence of pairs is renumbered, and the new numbering starts each sequence with the number 1. Each m=1 sequence has a single pair, in which the block is renumbered as block-1 and the FF renumbered as FF-1. Each m>1 sequence has its original pair renumbered as 1, and each replicated pair is consecutively renumbered while maintaining the existing sequence of pairs; the next pair starts with number 2 as the lowest-numbered replicated pair, and so on in their previously determined phase sequence. Accordingly, the lowest-phase original pair is renumbered as block-1/FF-1, the lowest replicated pair in the sequence is renumbered as block-2/FF-2, etc., up to the mth pair in the sequence which will have a number which is not be greater than N.

For example, if an original block has its outputs sampled by three FFs operating at phases 2, 4 and 7, that original block has an m value of three. It has two block replications determined by m−1=2. The original and two replicated blocks form a sequence of three pairs respectively having original FFs 2, 4 and 7, and the three pairs are initially numbered 2, 4 and 7. Then these pairs are respectively renumbered with consecutive numbers 1, 2 and 3, providing pairs: block-1/FF-1, block-2/FF-2 and block-3/FF-3. The renumbered FFs may be considered new FFs, or they may be considered the old FFs that have merely been renumbered 1 through m, to enable defining the next operation for this invention. Each replicated block I in the sequence has a renumbered value from 2 to m, which is in the range of values represented by the expression 2<=I<=N. In that sequence, block-1 sampled by FF-1 is the original block and its associated FF.

Next in step 105, the blocks and associated FFs of the renumbered pairs are repositioned and reconnected into a single-phase version of the logic design for this invention. The renumbering provides the last-described consecutive 1 to m numbering which is next used for uniquely reconnecting the blocks and associated FFs in a transformed logic arrangement which is logically the same as the original logic circuit design. The block connections are as follows: The output of logic block-1 is connected to the phase-triggered input of FF-1. The output of FF-1 is connected to an input of block-1, and to an input of each of the replicated blocks. The output of block-I is connected to the phase triggered input of FF-I. Also, the output of logic block-I is connected to an input of logic block-1 and to an input of each replicated logic block J which is greater than I, i.e. (I<J<=N). The output of FF-I is an input to each logic block J, i.e. (2<=J<=I).

A final clock phase reconnection is done which changes the triggering clock phase for each FF to the same clock phase, which is phase 1 in the preferred embodiment. Any FF in the logic design not having its triggering phase changed to phase 1 is removed or bypassed. The transformed single-phase version of the logic design remains, and is used as the basis for generating the logic representation to be input to a simulator/emulator.

While the invention has been described in detail herein in accordance with certain embodiments thereof, many modifications and changes therein may be effected by those skilled in the art. Accordingly, it is intended by the appended claims to cover all such modifications and changes as fall within the true spirit and scope of the invention.

Having thus described our invention, what we claim as new and desire to secure by letters patent is:

1. A logic translation method for increasing simulation/emulation efficiency in a computerized system provided for executing simulation/emulation programs for a multi-phase logic circuit design, the multi-phase logic design containing original logic blocks and original FFs, comprising the steps of:

identifying each original logic block in the multi-phase logic circuit design, identifying each original flip-flop (FF) sampling an output of each logic block in the multi-phase logic design, and identifying each original logic block having plural FFS sampling the output at plural clock phases, associating each original FF with one of the multi-phases that triggers the input of the FF, replicating one or more times each logic block identified as being sampled by a plurality of original FFs, the number of replications being equal to one less than the plurality of associated FFs, and connecting each original logic block with the replicated logic block(s) and associated original FFs into a logic block arrangement having a plurality of block outputs equal to the number of associated FFs, and changing the clock multi-phase triggering of the associated FFs to single-phase clock triggering for logic block arrangements to obtain a single-phase logic design which provides outputs in a single phase of operation equivalent to outputs in all phases of operation in the multi-phase logic design.

2. A logic translation method for increasing simulation/emulation efficiency in a computerized system as defined in claim 1, the multi-phase logic design containing original logic blocks and original FFs, the connecting step further comprising:

connecting the output of each replicated logic block to a respective one of the associated FFs for storing the output of the logic blocks in each logic block arrangement.

3. A logic translation method for increasing simulation/emulation efficiency in a computerized system as defined in claim 2, the multi-phase logic design containing original logic blocks and original FFs, the replicating step further comprising:

counting all clock phases connected to all FF(s) receiving outputs of an original logic block to obtain a number m having a value in a range from 1 to N in which N is the total number of clock phases in the multi-phase logic design, and number m being associated with each original logic block, each original logic block having an m value of either m=1 or m>1, replicating m−1 number of times each original logic block to provide replicated logic blocks identical to each original logic block having an m>1 value, and not replicating any original logic block having number m equal to 1 (m=1).

4. A logic translation method for increasing simulation/emulation efficiency in a computerized system as defined in claim 3, the multi-phase logic design containing original logic blocks and original FFs, the replicating step further comprising:

assigning phase numbers in ascending sequence to each m number of blocks comprised of each original logic block and any replicated block(s), the phase numbers being the respective clock phases connected to FF(s) receiving outputs of the original logic block, the FF(s) being initially numbered by the respective clock phase, reassigning in sequence consecutive connection numbers from 1 to m to respectively replace the phase numbers assigned by the assigning step to provide an m=1 type of block/FF sequence and an m>1 type of block/FF sequence, and each sequence containing an original logic block/FF assigned the number 1 as the lowest number in each sequence.

5. A logic translation method for increasing simulation/emulation efficiency in a computerized system as defined in claim 4, the reconnecting step further comprising:

connecting in each block/FF sequence 1 to m the output of each logic block to the input of a FF having the same assigned number, and connecting the output of the FF to an input of the logic block, connecting an output of each logic block I to an input of a FF having the same assigned number greater than 1 in each m>1 sequence, connecting the output of logic block-I to an input of logic block-1 and to an input of each logic block J greater than I, i.e. (I<J<=N) in each m>1 sequence, and connecting the output of FF-I as an input to each logic block J in which 2<=J<=I in each m>1 sequence.

6. A logic translation method for increasing simulation/emulation efficiency in a computerized system as defined in claim 5, the reconnecting step further comprising:

connecting a same clock phase to a clock input of each FF in each sequence in a logic design.

7. A logic translation method for increasing simulation/emulation efficiency in a computerized system as defined in claim 6, the reconnecting step further comprising:

selecting clock phase 1 as the clock phase connected to all FFs operating in the logic design.

8. A logic translation method for increasing simulation/emulation efficiency in a computerized system as defined in claim 6, the reconnecting step further comprising:

generating a computerized representation of the logic blocks and FFs in the logic design for input to a simulator/emulator.

9. A logic translation method for a computerized system executing simulations/emulations of logic circuit designs, comprising the steps of:

identifying logic blocks (original blocks) of a multi-phase clocked logic design having block outputs stored in flip-flops (FFs) during multi-phase clock cycles, and associating with each original block the clock phase(s) applied to FFs receiving output from each original block, a number m being a count of the number of clock phases for each original block, and phase number(s) for the phase(s) applied to the FF(s) of each original block being a sequence of m phase numbers associated with each original block, replicating m−1 logic block(s) for each logic block having an associated sequence of more than one phase number (m>1), and not replicating any original block having m=1, each original block and each replicated block assigned to provide output to one of the FF(s) receiving output from the original block in the multi-phase logic design, and connecting the output(s) of the FFs to inputs of each original block and its replicated logic block(s), and connecting outputs of the blocks to the FFs and other blocks to set the FFs in the same clock cycle to the same values as would be set in the multi-phase logic design during multiple phases of each clock cycle.

10. A logic translation method for a computerized system executing simulations/emulations of logic circuit designs as defined in claim 9, the connecting steps further comprising:

connecting in parallel each original block and its replicated block(s) respectively to inputs of the FFs in a logic block arrangement associated with the original logic block, and changing the clocking phase of each FF in the logic block arrangement to single-phase clocking to obtain a single-phase logic design which sets in the same cycle all FFs associated with each original block to states equivalent to the states of the FFs set in multiple phase cycles in the multi-phase logic design for simulating or emulating identical logic stored environments.

* * * * *